(12) United States Patent
Kazama

(10) Patent No.: US 7,196,857 B2
(45) Date of Patent: Mar. 27, 2007

(54) IMAGE PICKUP MODULE, METHOD OF MANUFACTURING THE SAME, AND SPACER WITH INFRARED RAY CUT FILM

(75) Inventor: Yoichi Kazama, Nagano (JP)

(73) Assignee: Shinko Electric Industries CO., Ltd., Nagano (JP)

( * ) Notice: Subject to any disclaimer, the term of this patent is extended or adjusted under 35 U.S.C. 154(b) by 0 days.

(21) Appl. No.: 11/291,356

(22) Filed: Dec. 1, 2005

(65) Prior Publication Data

US 2006/0126194 A1    Jun. 15, 2006

(30) Foreign Application Priority Data

Dec. 14, 2004    (JP) .............................. 2004-360998

(51) Int. Cl.
*G02B 7/02* (2006.01)
(52) U.S. Cl. .................... 359/811; 359/819; 359/813; 359/829; 359/822
(58) Field of Classification Search ............... 359/811, 359/813, 819, 821, 822, 823, 827, 829
See application file for complete search history.

(56) References Cited

U.S. PATENT DOCUMENTS 6,590,720 B2    7/2003    Oba

FOREIGN PATENT DOCUMENTS

JP    2004-147032    5/2004
JP    2004-235547    8/2004

*Primary Examiner*—Timothy Thompson
(74) *Attorney, Agent, or Firm*—Rankin, Hill, Porter & Clark LLP

(57) ABSTRACT

An image pickup module comprises a substrate mounting an image pickup element thereon, a holder mounted on the substrate so as to cover the image pickup element, the holder including a barrel portion for supporting a light receiving lens, the barrel portion having a stopper portion at its inner circumferential surface, a lens holder holding the light receiving lens, the lens holder being screwed and fixed into the barrel portion of the holder, and a spacer interposed between the stopper portion of the holder and the lens holder, the spacer being integrally formed with a sheet-like infrared ray cut film.

12 Claims, 6 Drawing Sheets

IMAGE PICKUP MODULE, METHOD OF MANUFACTURING THE SAME, AND SPACER WITH INFRARED RAY CUT FILM

This application claims foreign priority based on Japanese Patent application No. 2004-360998, filed Dec. 14, 2004, the contents of which is incorporated herein by reference in its entirety.

BACKGROUND OF THE INVENTION

1. Field of the Invention

The present invention relates to an image pickup module on which an image pickup element is mounted, for use in an image pickup apparatus, etc., and to a spacer which has an infrared ray cut film, for use in the image pickup module. The present invention also relates to a method of manufacturing the image pickup module.

2. Description of the Related Art

Various types of products are provided as an image pickup module on which an image pickup element such as a CCD (charge-coupled device) or a CMOS (complementary metal-oxide semiconductor) is mounted (for example, refer to JP-A-2004-147032 and JP-A-2004-235547). FIG. 5 shows an example of an image pickup module configured in such a manner that a light receiving lens 12 is supported by a barrel portion 10a of a holder 10 through a lens holder 11, and that a mounting surface side of a substrate 20, on which an image pickup element 21 is mounted, is accommodated in a casing portion 10b of the holder 10.

This image pickup module is formed as follows. That is, first, an infrared ray cut glass filter 13 is attached to the inner surface of the casing portion 10b so as to seal an opening hole 10c of the barrel portion 10a. Thereafter, the lens holder 11 in which the light receiving lens 12 is mounted is placed into the barrel portion 10a through a spacer 14 made of silicon rubber, by being screwed into the barrel portion 10a (see FIG. 6A). Then, the substrate 20 is bonded to an opening end surface of the casing portion 10b (see FIG. 6B).

The spacer 14 is compressed between an end surface of a stopper portion 10d which is formed on the inner circumferential surface of a base part of the barrel portion 10a and an end surface of the lens holder 11, by screwing and fastening the lens holder 11 to the barrel portion 10a. The spacer 14 has a function of securely holding the lens holder 11 in the barrel portion 10a by preventing the lens holder 11 from turning. Also, the spacer 14 has a function of adjusting a distance between the light receiving lens 12 and the image pickup element 21 to a certain distance by tightening and fixing the lens holder 11 to the barrel portion 10a.

As described above, the product of image pickup module of the related art having the holder 10 and the substrate 20 is configured in such a manner that the infrared ray cut glass filter 13 is attached to the base part of the barrel portion 10a of the holder 10 (that is, the inner surface side of the casing portion 10b) so as to seal the opening hole 10c. Thus, a process of assembling the image pickup module requires a step of bonding the glass filter 13. Because of the configuration in which the glass filter 13 is attached to the inner surface of the casing portion 10b of the holder 10, it is necessary to assure a space for accommodating the glass filter 13 in the casing portion 10b. Consequently, the problem arises that the miniaturization of the image pickup module is restricted.

SUMMARY OF THE INVENTION

An object of the invention is to miniaturize an image pickup module assembled by joining a substrate on which an image pickup element is mounted, to a holder. Another object of the invention is to provide an image pickup module which enables to enhance mass productivity by simplifying a manufacturing process. Further object of the invention is to provide a spacer with an infrared ray cut film, which is appropriately used for manufacturing this image pickup module. Further object of the invention is to provide a method of manufacturing the image pickup module.

An image pickup module of the invention comprises a substrate mounting an image pickup element thereon; a holder mounted on the substrate so as to cover the image pickup element, the holder including a barrel portion for supporting a light receiving lens, the barrel portion having a stopper portion at its inner circumferential surface; a lens holder holding the light receiving lens, the lens holder being screwed and fixed into the barrel portion of the holder; and a spacer interposed between the stopper portion of the holder and the lens holder, the spacer being integrally formed with a sheet-like infrared ray cut film.

In the image pickup module of the invention, the spacer is formed like a frame, the sheet-like infrared ray cut film is formed in accordance with an inside diameter of the barrel portion, and the spacer is bonded to a peripheral edge portion of one surface of the sheet-like infrared ray cut film.

In the image pickup module of the invention, the sheet-like infrared ray cut film includes a film base material which transmits visible light, and an infrared ray cut filter layer which is disposed on one surface of the film base material. The filter layer is formed by accumulating a plurality of optical refractive layers.

In the image pickup module of the invention, the spacer is made of silicon rubber. Thus, when the lens holder is screwed and fixed into the barrel portion, the lens holder can appropriately be prevented from turning and also can be held, due to the elasticity of the spacer.

In the image pickup module of the invention, a film material is attached to one surface, which is in contact with an end surface of the lens holder, of the spacer.

In the image pickup module of the invention, the holder further includes a casing portion for accommodating the image pickup element mounted on the substrate, and the substrate is bonded to an opening end surface of the casing portion in a state that positions of the light receiving lens and the image pickup element are aligned.

A spacer of the invention, with a sheet-like infrared ray cut film, used in an image pickup module, is integrally formed with the sheet-like infrared ray cut film.

In the spacer with the infrared ray cut film of the invention, the sheet-like infrared ray cut film is formed in accordance with an inside diameter of a barrel portion formed in a holder of the image pickup module, the spacer is formed like a frame, and the spacer is bonded to a peripheral edge portion of one surface of the sheet-like infrared ray cut film.

In the spacer with the infrared ray cut film of the invention, the sheet-like infrared ray cut film includes a film base material which transmits visible light, and an infrared ray cut filter layer which is disposed on one surface of the film base material.

In the spacer with the infrared ray cut film of the invention, the spacer is made of silicon rubber.

A method of manufacturing an image pickup module of the invention, the image pickup module including a substrate mounting an image pickup element thereon, a holder including a barrel portion which has a stopper portion at its inner circumferential surface, a lens holder holding a light receiving lens, and a spacer, the method comprises: mounting the holder on the substrate so as to cover the image pickup element; inserting the spacer that is integrally formed with a sheet-like infrared ray cut film into the barrel portion of the holder; and screwing and fastening the lens holder to the barrel portion in a state that the spacer integrally formed with the sheet-like infrared ray cut film is interposed between the stopper portion of the holder and the lens holder.

DESCRIPTION OF THE PRFERRED EMBODIMENTS

Hereinafter, a preferred embodiment of the invention is described in detail with reference to the accompanying drawings.

Figure 1:
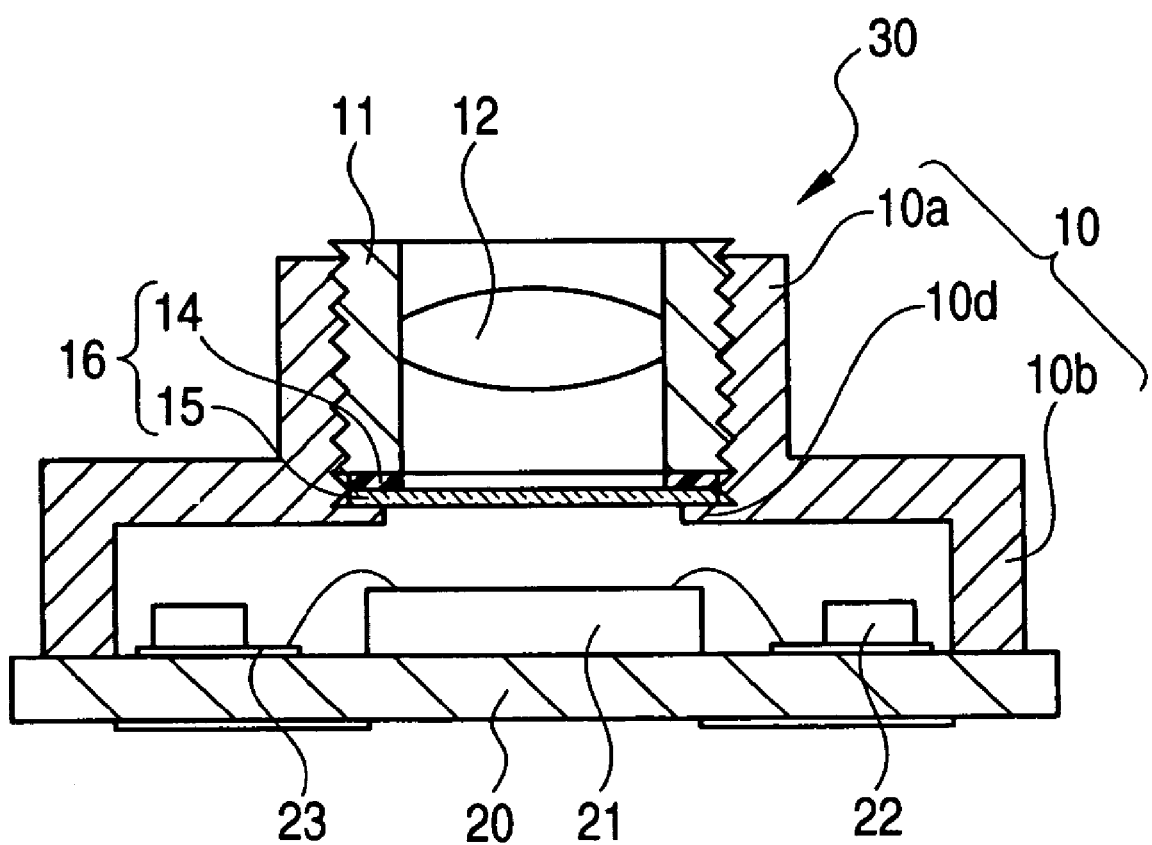
FIG. 1 is a cross-sectional view illustrating configuration of an embodiment of an image pickup module according to the invention.
Figure 5:
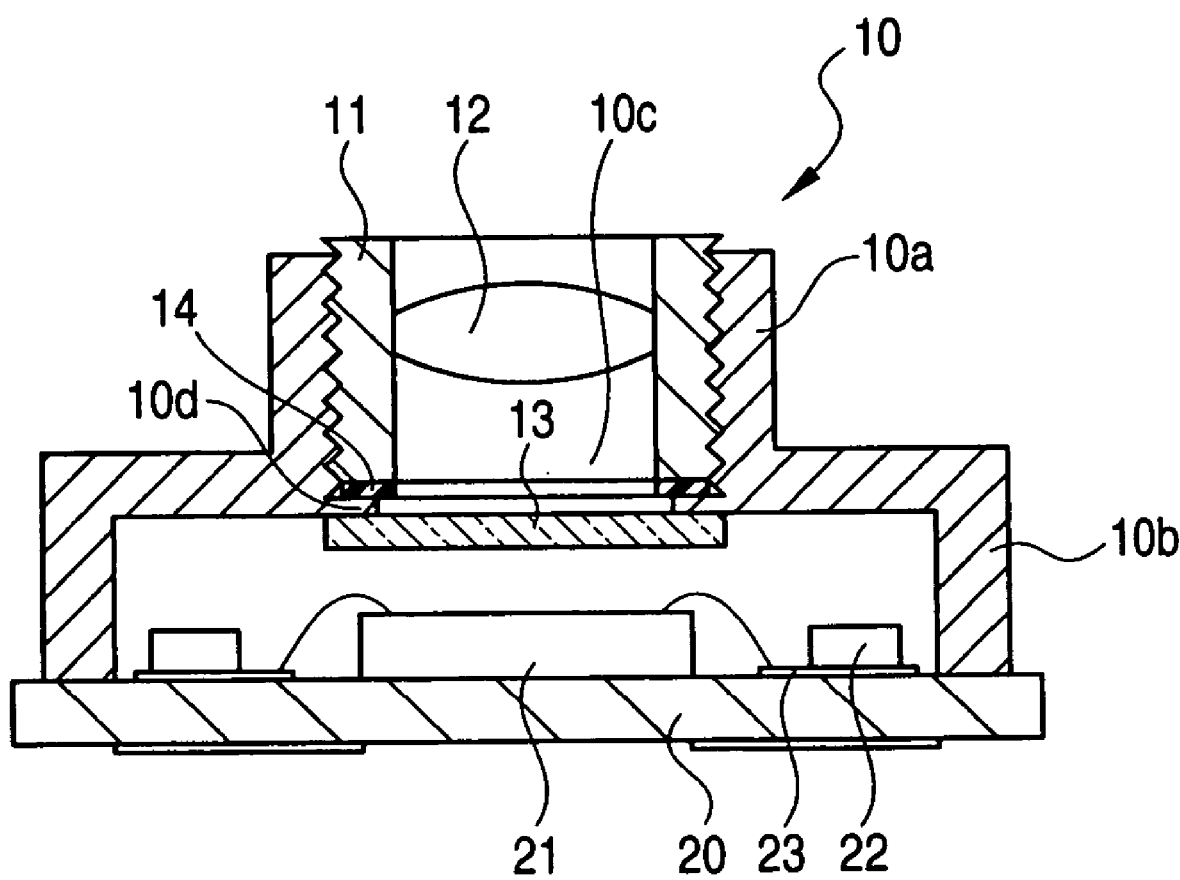
FIG. 5 is a cross-sectional view illustrating a configuration of an image pickup module of the related art.
Figure 6A:
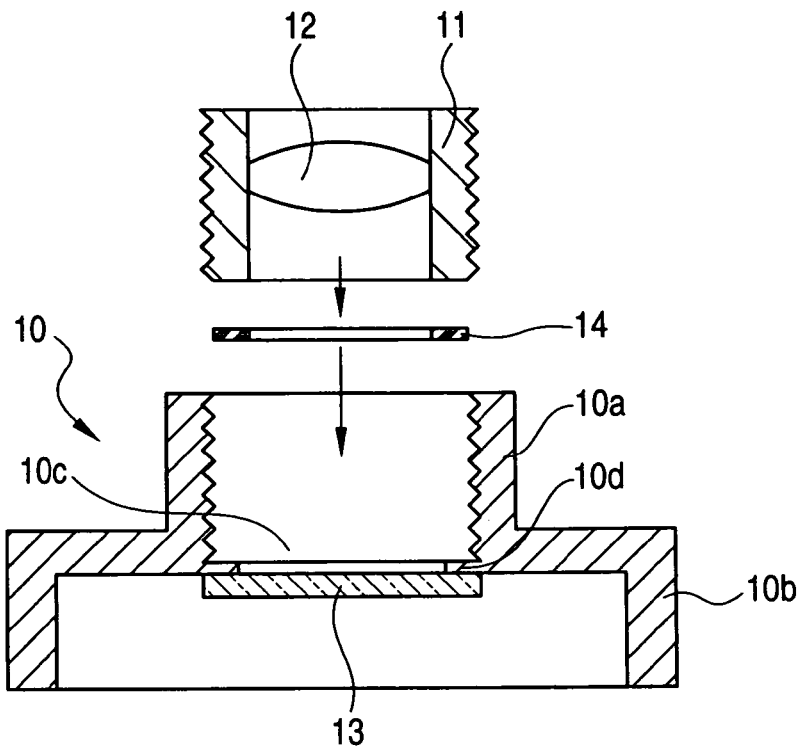
FIGS. 6A and 6B are explanatory views illustrating a process of assembling an image pickup module of the related art.
Figure 6B:
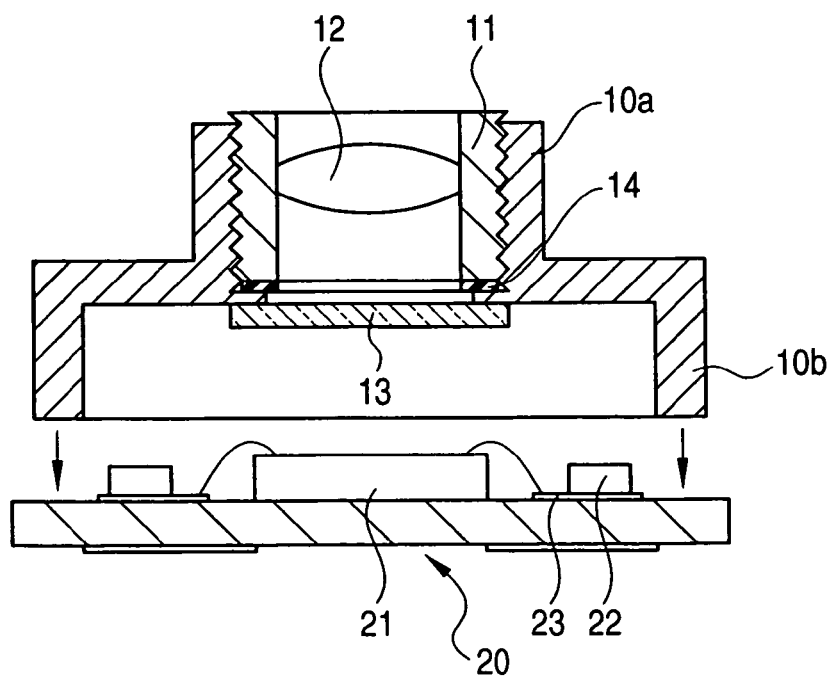

FIG. 1 shows a configuration of an embodiment of an image pickup module 30 according to the invention. The image pickup module 30 has a holder 10 which supports a light receiving lens 12, and also has a substrate 20 attached to the holder 10. The configurations of a barrel portion 10a and a casing portion 10b of which shape in plan view is rectangular, which configure the body of the holder 10, are similar to those of the holder 10 of the image pickup module of the related art shown in FIG. 5. The configuration of the substrate 20 on which an image pickup element 21 and a chip component 22 are mounted is similar to that of the substrate 20 of the image pickup module of the related art shown in FIG. 5.

Incidentally, a female screw is provided in an inner circumferential surface of the cylindrically formed barrel portion 10a of the holder 10. A male screw formed on an outer circumferential surface of a lens holder 11 is to be screwed onto the female screw. A stopper portion 10d protruded like a projection is provided on the inner circumferential surface of a base part side of the barrel portion 10a. The lens holder 11 is fastened and fixed to the barrel portion 10a so as to be screwed into the barrel portion 10a.

In the image pickup module 30 according to this embodiment, the lens holder 11 is mounted in the barrel portion 10a by interposing a spacer 16 with an infrared ray cut film between an end surface of the stopper portion 10d and an end surface of the lens holder 11.

That is, in the image pickup module of the related art, the lens holder 11 is fixedly fastened to the barrel portion 10a by interposing the spacer 14 made of silicon rubber between the end surface of the stopper portion 10d and the end surface of the lens holder 11. On the other hand, in this embodiment, a sheet-like infrared ray cut film 15 is used instead of the infrared ray cut glass filter 13, and the spacer 16 formed by integrating the sheet-like infrared ray cut film 15 and the spacer 14 made of silicon rubber is interposed between the lens holder 11 and the stopper portion 10d in the barrel portion 10a.

Figure 3A:
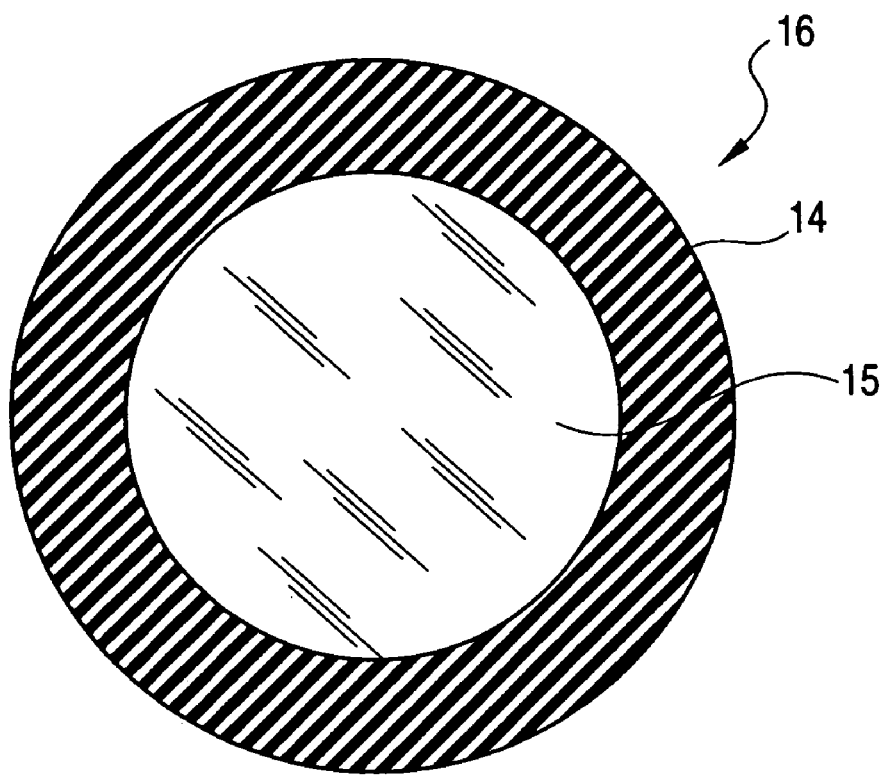
FIGS. 3A and 3B are a plan view and a cross-sectional view of a spacer with an infrared ray cut film, respectively.
Figure 3B:
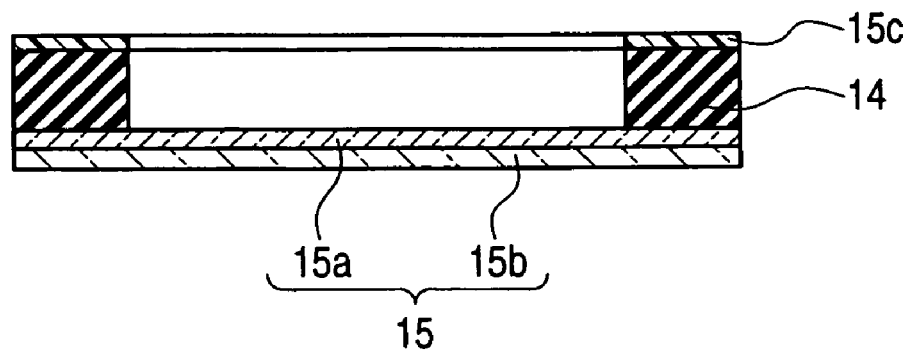

FIGS. 3A and 3B shows an enlarged view of the configuration of the spacer 16 with the infrared ray cut film. FIG. 3A is a plan view of a single spacer 16 with the film. FIG. 3B is a cross-sectional view thereof.

The spacer 16 with the film is formed by bonding the spacer 14 onto a peripheral edge portion of the surface on one side of the sheet-like infrared ray cut film (an IR filter) 15 which is shaped into a circle whose diameter is adjusted to the inside diameter of the barrel portion 10a. The spacer 14 is formed ring-like and is made of silicon rubber.

The sheet-like infrared ray cut film 15 is formed by providing a filter layer 15b which cuts infrared rays, on a surface of a film base material 15a such as polyester, which transmits visible light. The filter layer 15b can be formed as an optical filter which appropriately transmits light in a certain wavelength region, by depositing or laminating by a sputter, etc., materials such as metals or oxides, which have appropriate refractive indices.

The spacer 14 constituting the spacer 16 with infrared ray cut film is bonded onto a surface of the film base material 15a, the surface opposite to the surface on which the filter layer 15b is formed. A film material 15c made of material such as polyester, having good slidability is bonded onto a surface in the direction of thickness of the spacer 14 (that is, the surface opposite to the surface to which the film base material 15a is bonded).

Figure 4A:
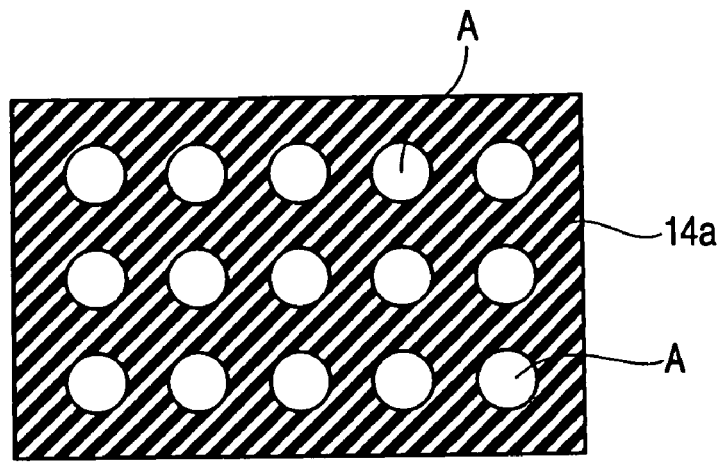
FIGS. 4A to 4D are explanatory views illustrating a method of manufacturing the spacer with the infrared ray cut film.

FIGS. 4A to 4D show a method of manufacturing the spacer 16 with the film. FIG. 4A shows a state in which a punching operation is performed for forming through holes A in a film 14a made of silicon rubber to be employed as a base material of the spacer 14, so as to adjust the inside diameter of each of the through holes A to that of the spacer 14. Each of the through holes A is formed in the film 14a by leaving spaces to be used for punching the outer circumference of the spacer 14. A film material 15c (not shown) is bonded to one of the surfaces of the film 14a.

Figure 4B:
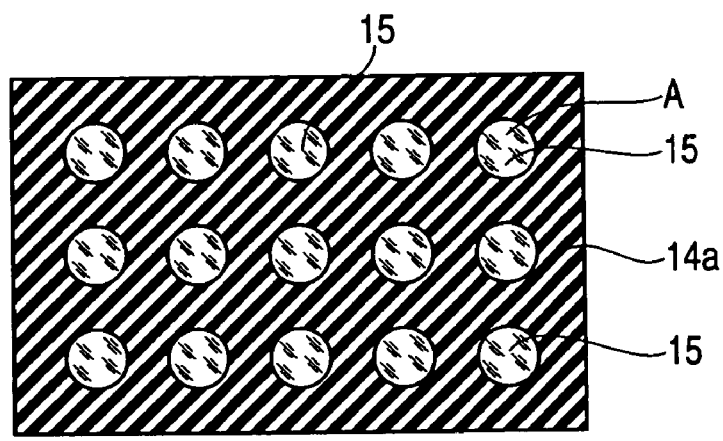

FIG. 4B shows a state wherein the sheet-like infrared ray cut film 15 is bonded to one side surface of the film 14a in which the through holes A are punched, so as to cover the through holes A. The sheet-like infrared ray cut film 15 is exposed in each of the through holes A from the side of the film 14a to which the film material 15c is bonded, by bonding the sheet-like infrared ray cut film 15 to the film 14a.

Incidentally, when the sheet-like infrared ray cut film 15 is bonded to the film 14a, the film base material 15a is bonded to the opposite surface (other surface) of the film 14a, the surface opposite to the surface to which the film material 15c is bonded.

Figure 4C:
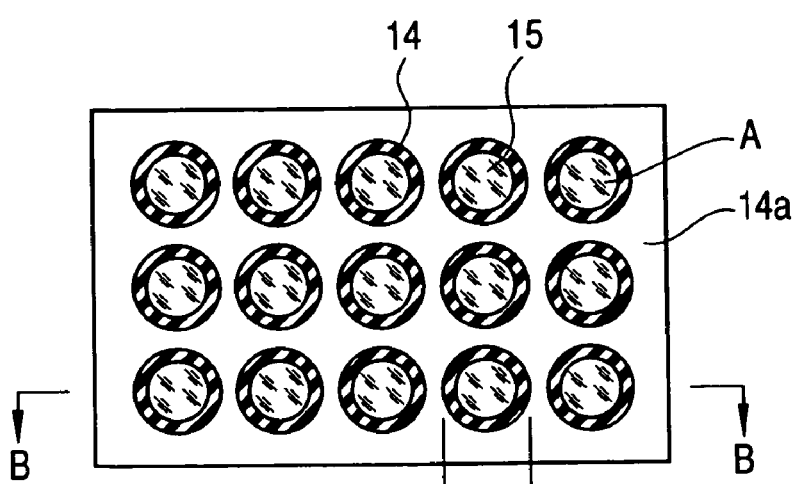

FIG. 4C shows a state wherein outer hole punching is performed on a bonded body formed by bonding the sheet-like infrared ray cut film 15 and the film 14a, according to the outside diameter of the spacer 16 with the infrared ray cut film.

Figure 4D:
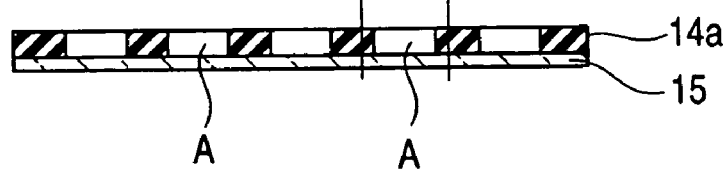

FIG. 4D is a cross-sectional view taken on line B—B shown in FIG. 4C, which shows a state of the bonded body before the process of outer hole punching. The sheet-like infrared ray cut film 15 is bonded to the other surface of the film 14a (the surface opposite to the surface to which the film material 15c is bonded) in which the through holes A are formed. The spacer 16 with the infrared ray cut film can be obtained by adjusting a position for each of the through holes A to perform outer hole punching, and performing the outer hole punching on the bonded body.

The structure, material, dimensions, etc. of the spacer 16 with the infrared ray cut film can appropriately be selected according to the use of the image pickup module 30 and the like. In the case of the spacer 16 with the sheet-like infrared ray cut filter used in the image pickup module 30 according to this embodiment, the outside diameter of the sheet-like infrared ray cut film 15 is 7 mm. The outside diameter and the inside diameter of the spacer 14 are 7 mm and 5 mm, respectively. The film base material 15a used in the sheet-like infrared ray cut film 15 is a film having a thickness of 0.1 mm and made of polyester. The thickness of the filter layer 15b is 0.1 mm. The thickness of the spacer 14 (silicon rubber) is 0.7 mm. The film material 15c is a film having a thickness of 0.1 mm and made of polyester.

Figure 2A:
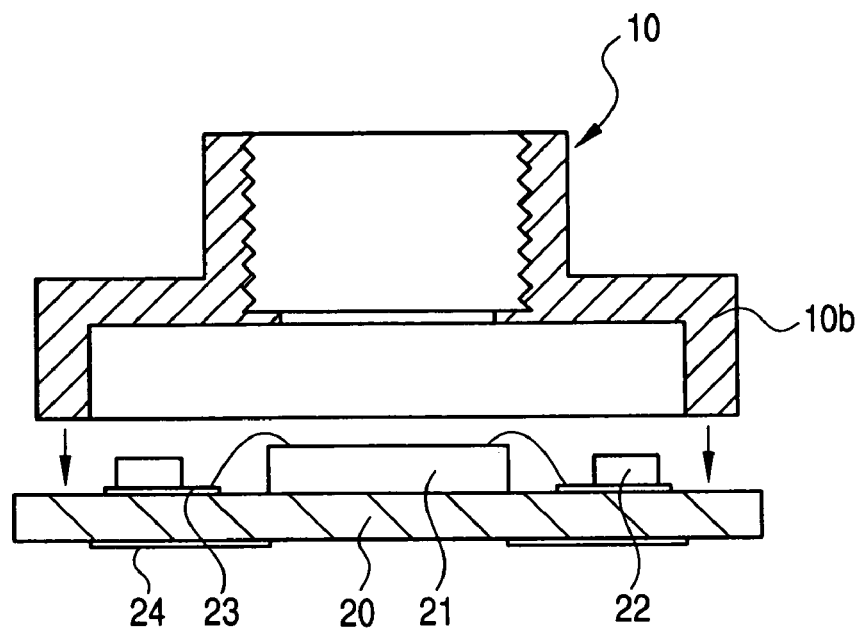
FIGS. 2A and 2B are explanatory views illustrating a process of assembling the image pickup module.
Figure 2B:
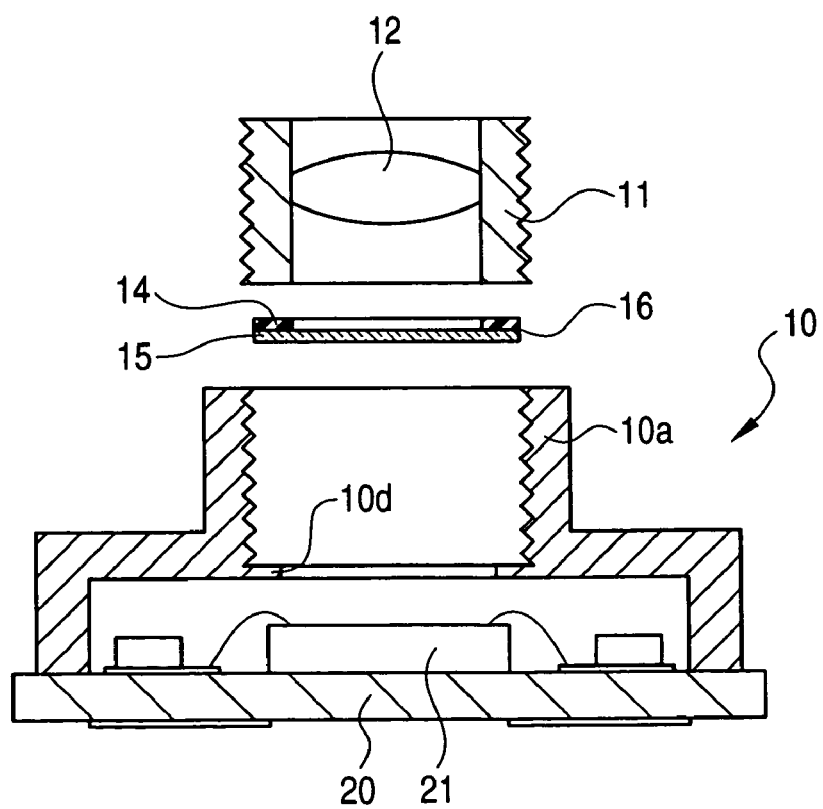

FIGS. 2A and 2B show the process of assembling the image pickup module 30 using the spacer 16 with the infrared ray cut film obtained in this manner.

FIG. 2A shows a step of mounting the casing portion 10b of the holder 10 on the substrate 20. The image pickup element 21 and the chip component 22 are mounted on the substrate 20 in advance. The image pickup element 21 and a wiring pattern 23 are electrically connected to each other by wire bonding. A mounting electrode 24 used for surface-mounting the image pickup module 30 is provided on the outer surface (that is, the mounting surface) of the substrate 20. The electrode 24 and the wiring pattern 23 are electrically connected to each other through a through hole provided in the substrate 20. The holder 10 is mounted on the substrate 20 by bonding an end surface of the casing portion 10b to the substrate 20 with an adhesive.

FIG. 2B shows a step of mounting the light receiving lens 12 in the holder 10 mounted on the substrate 20. The spacer 16 with the infrared ray cut film is inserted into the barrel portion 10a of the holder 10. The lens holder 11 having the light receiving lens 12 in a cylindrical body thereof, is screwed and fastened to the barrel portion 10a. The spacer 16 with the film is mounted in the barrel portion 10a so that the sheet-like infrared ray cut film 15 abuts on the stopper portion 10d.

FIG. 1 shows a state in which the image pickup module 30 is assembled by securely fastening the lens holder 11 to the barrel portion 10a.

In the method of assembling the image pickup module 30 according to this embodiment, the spacer 16 with the infrared ray cut film is utilized which is formed as a single component by integrating the sheet-like infrared ray cut film 15 and the spacer 14. Accordingly, in the process of assembling the image pickup module 30 by mounting the lens holder 11 in the barrel portion 10a, the spacer 14 and the sheet-like infrared ray cut film 15 can be mounted therein only by interposing the spacer 16 with the infrared ray cut film between the stopper portion 10d and the lens holder 11. Thus, an operation of mounting the spacer 14 and that of mounting the infrared ray cut filter can be performed at one time.

Consequently, an operation of bonding the infrared ray cut filter to the inner surface of the casing portion 10b of the holder 10 can be omitted. This enables the simplification of the process of assembling the image pickup module.

Further, when the lens holder 11 is fixedly fastened to the barrel portion 10a, the sheet-like infrared ray cut film 15 and the spacer 14 are interposed between the end surface of the lens holder 11 and the end surface of the stopper portion 10d.

Thus, the spacer 14 and the sheet-like infrared ray cut film 15 are compressed. A surface of the spacer 14 abutting on an end surface of the lens holder 11 is covered with the film material 15c made of polyester having good slidability. Thus, when the lens holder 11 is fixedly fastened to the barrel portion 10a, the spacer 14 does not twist. A pressurizing force can adequately be applied to the spacer 14. Accordingly, the lens holder 11 is mounted in the barrel portion 10a so as to be surely prevented from turning.

Further, the sheet-like infrared ray cut film 15 and the spacer 14 abut against the stopper portion 10d and are supported by being compressed by the lens holder 11. Thus, the opening hole 10c of the barrel portion 10a is hermetically sealed by the sheet-like infrared ray cut film 15. The inside of the casing portion 10b accommodating the image pickup element 21 is air-tightly sealed from the outside. Consequently, dust can be prevented from entering the casing portion 10b from the outside so that the reliability of the image pickup module 30 can be enhanced.

Additionally, in the image pickup module 30 according to this embodiment, the spacer 16 with the infrared ray cut film which is formed by integrating the spacer 14 and the sheet-like infrared ray cut film 15 is attached to the barrel portion 10a so as to be assembled thereinto. Thus, a separation distance between the spacer 14 and the infrared ray cut filter can be minimized. Also, as the infrared ray cut filter is formed with a film having thin thickness, the spacer 16 with the infrared ray cut film is formed so that the overall thickness of the spacer 16 is made extremely thin. Consequently, the miniaturization of the image pickup module can be achieved.

Further, in a case when the infrared ray cut filter is formed like a film, reduction in thickness of the filter can be achieved. However, it is difficult to handle the infrared ray cut filter of which thickness is thin. In contrast, as in this embodiment, the sheet-like infrared ray cut film 15 is combined with the spacer 14, there is an advantage in facilitating the handling of the sheet-like infrared ray cut film 15.

The image pickup module according to the invention is assembled by using a spacer with an infrared ray cut film, which is formed by integrating a spacer and a sheet-like infrared ray cut film. Thus, the process of assembling the image pickup module can be simplified. Also, the miniaturization of the image pickup module can be achieved. The use of the spacer with the infrared ray cut film according to the invention facilitates an operation of assembling the image pickup module and enables the miniaturization of the image pickup module.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. An image pickup module comprising:
    a substrate mounting an image pickup element thereon;
    a holder mounted on the substrate so as to cover the image pickup element, the holder including a barrel portion for supporting a light receiving lens, the barrel portion having a stopper portion at its inner circumferential surface;
    a lens holder holding the light receiving lens, the lens holder being screwed and fixed into the barrel portion of the holder; and a spacer interposed between the stopper portion of the holder and the lens holder, the spacer being integrally formed with a sheet-like infrared ray cut film.

2. The image pickup module according to claim 1, wherein the spacer is formed like a frame, the sheet-like infrared ray cut film is formed in accordance with an inside diameter of the barrel portion, and the spacer is bonded to a peripheral edge portion of one surface of the sheet-like infrared ray cut film.

3. The image pickup module according to claim 1, wherein the sheet-like infrared ray cut film includes a film base material which transmits visible light, and an infrared ray cut filter layer which is disposed on one surface of the film base material.

4. The image pickup module according to claim 1, wherein the spacer is made of silicon rubber.

5. The image pickup module according to claim 4, wherein a film material is attached to one surface, which is in contact with an end surface of the lens holder, of the spacer.

6. The image pickup module according to claim 1, wherein the holder further includes a casing portion for accommodating the image pickup element mounted on the substrate, and the substrate is bonded to an opening end surface of the casing portion in a state that positions of the light receiving lens and the image pickup element are aligned.

7. A spacer with a sheet-like infrared ray cut film used in an image pickup module, said spacer being integrally formed with the sheet-like infrared ray cut film.

8. The spacer according to claim 7, wherein the sheet-like infrared ray cut film is formed in accordance with an inside diameter of a barrel portion formed in a holder of the image pickup module,
the spacer is formed like a frame, and
the spacer is bonded to a peripheral edge portion of one surface of the sheet-like infrared ray cut film.

9. The spacer according to claim 7, wherein the sheet-like infrared ray cut film includes a film base material which transmits visible light, and an infrared ray cut filter layer which is disposed on one surface of the film base material.

10. The spacer according to claim 7, wherein the spacer is made of silicon rubber.

11. A method of manufacturing an image pickup module including a substrate mounting an image pickup element thereon, a holder including a barrel portion which has a stopper portion at its inner circumferential surface, a lens holder holding a light receiving lens, and a spacer, said method comprising:
mounting the holder on the substrate so as to cover the image pickup element;
inserting the spacer that is integrally formed with a sheet-like infrared ray cut film into the barrel portion of the holder; and
screwing and fastening the lens holder to the barrel portion in a state that the spacer integrally formed with the sheet-like infrared ray cut film is interposed between the stopper portion of the holder and the lens holder.

12. The method according to claim 11 further comprising:
integrally forming the spacer with the sheet-like infrared ray cut film.

* * * * *